United States Patent [19]

Hsu

[11] Patent Number: 5,710,056

[45] Date of Patent: Jan. 20, 1998

[54] DRAM WITH A VERTICAL CHANNEL STRUCTURE AND PROCESS FOR MANUFACTURING THE SAME

[75] Inventor: Chen-Chung Hsu, Taichung, Taiwan

[73] Assignee: United Microelectronics Corporation, Taiwan

[21] Appl. No.: 706,700

[22] Filed: Sep. 6, 1996

[30] Foreign Application Priority Data

Jun. 29, 1996 [TW] Taiwan .................................. 85107907

[51] Int. Cl.[6] .................................................. H01L 21/8242
[52] U.S. Cl. ............................. 437/60; 437/203; 437/919
[58] Field of Search ................................. 437/60, 77, 78, 437/192, 203, 919; 148/DIG. 50

[56] References Cited

U.S. PATENT DOCUMENTS

| 4,833,094 | 5/1989 | Kenney | 437/203 |
| 4,873,205 | 10/1989 | Critchlow et al. | 437/60 |
| 5,362,665 | 11/1994 | Lu | 437/60 |

Primary Examiner—Charles L. Bowers, Jr.
Attorney, Agent, or Firm—Rabin, Champagne & Lynt, P.C.

[57] ABSTRACT

A DRAM with a vertical channel structure is manufactured with an epitaxial silicon layer, above a silicon substrate, and is preformed with a source region. A well is formed in the epitaxial silicon layer. A trench is formed to penetrate into the source region. A first insulating layer is formed on a surface of the trench and then a gate is formed, almost completely filling up the remaining space in the trench. A drain region is formed inside the well. A storage capacitor is formed above the drain region.

11 Claims, 4 Drawing Sheets

DRAM WITH A VERTICAL CHANNEL STRUCTURE AND PROCESS FOR MANUFACTURING THE SAME

BACKGROUND OF THE INVENTION

1. Field of the Invention

The invention relates in general to the fabrication and structure of a DRAM cell, and more particularly to the fabrication and structure of a DRAM cell with a vertical channel.

2. Description of the Related Art

DRAMs are now widely used in integrated circuits. A circuit diagram of a common high memory capacity DRAM cell is shown in FIG. 1. It consists of a MOSFET 100 whose gate is connected to a word line (WL), and a capacitor 102. One end of the source/drain region of the MOSFET 100 is connected to a bit line (BL), and the other end is connected to ground via the capacitor 102.

Conventional DRAMs suffer a disadvantage due to their inability to sustain a comparatively high level of integration. For the sake of clarity, the processing and structure of a conventional DRAM is explained with reference to the cross-sectional diagram of FIG. 2, as follows:

First, on top of a silicon substrate 200, a layer of field oxide 201, a gate oxide layer 202, a first polysilicon layer 203, and a pair of gate oxide sidewall spacers 204 are provided, along with an implanted source region 205 and an implanted drain region 206 situated on opposite sides, and below the level, of the gate oxide layer 202, within the silicon substrate 200. Also, a horizontal channel 207 is provided which links the source region 205 and the drain region 206. Next, a layer of silicon dioxide 208 is formed, and on top of the drain region 206, a contact window is etched out. Then a second polysilicon layer 209 is formed above and in the contact window. After that, a dielectric layer 210 is formed on the exposed surface of the second polysilicon layer 209. The dielectric layer can, for example, have either a nitride/oxide (NO) structure or an oxide/nitride/oxide (ONO) structure. Lastly, the capacitor structure is established by forming a third layer of polysilicon 211, over the dielectric layer 210.

As technology has progressed, the density requirements of memory devices have become more stringent. For DRAMs, the most economical and effective method of memory compaction is still shrinking the dimensions of each memory cell. Due to the horizontal channel layout of conventional DRAM design, reducing the dimensions of a memory cell is almost equivalent to reducing its channel length. However, when the channel is shortened, the short channel effect becomes more dominant, and the gate loses most of its switch controlling power in a MOS transistor.

SUMMARY OF THE INVENTION

It is therefore an object of the invention to provide a process of manufacturing a DRAM cell with a vertical channel, so that the level of integration for such a DRAM is increased without generating the adverse short channel effect.

To achieve this object of the invention, a process for manufacturing a DRAM with a vertical channel structure is provided. According to the method, a source region is formed on top of a silicon substrate. An epitaxial silicon layer then is formed above the source region, and active regions are defined in the epitaxial silicon layer. On the surface of the epitaxial silicon layer, a field oxide layer with a bird's beak structure is formed just outside the active area. Using the field oxide layer as a mask, a well is formed whose bottom is connected to the top surface of the source region. Then, a trench, passing through at least the well and connected to the source region, is formed. On the interior sidewalls of the trench, a first insulating layer is formed. A gate that almost completely fills a remaining space in the trench, is then formed. Then, a drain region is formed in the epitaxial silicon layer, between one edge of the gate and a remote edge of the bird's beak structure of the field oxide layer. Next, a second insulating layer is formed and defined, and a contact window is formed above the drain region. A storage capacitor then is formed in and above the contact window.

To achieve another object of this invention, a DRAM with a vertical channel structure is provided. The DRAM includes a silicon substrate, a source region on the surface of silicon substrate, a field oxide layer having a bird's beak structure, a well on the surface of the source region, a gate, and a drain region lying on the surface of the well and placed between one edge of the gate and a remote edge of the bird's beak structure. A trench passing through at least the well, is connected to the source region. A first insulating layer covers the interior side walls of the trench, the gate substantially filling a remaining space in the trench. A second insulating layer is also provided which has a contact window formed above the drain region. A storage capacitor is formed in and above the contact window.

BRIEF DESCRIPTION OF THE DRAWINGS

Other objects, features, and advantages of the invention will become apparent from the following detailed description of the preferred but non-limiting embodiments. The description is made with reference to the accompanying drawings in which.

DESCRIPTION OF THE PREFERRED EMBODIMENTS

Figure 1:
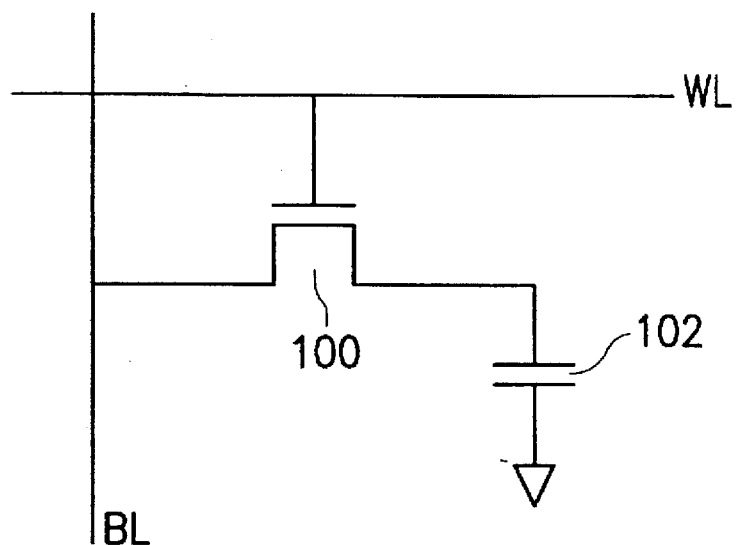
FIG. 1 is a circuit diagram of a DRAM cell.
Figure 2:
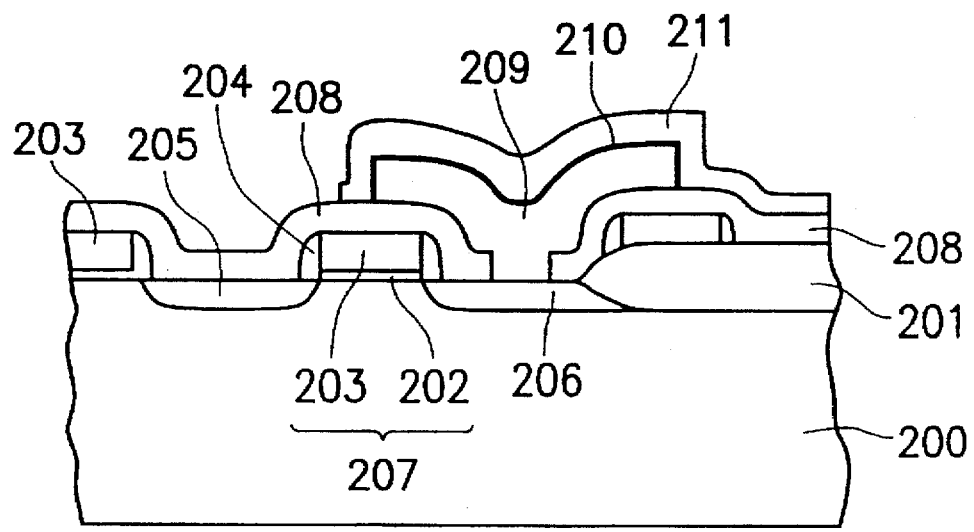
FIG. 2 is a cross-sectional view of a conventional DRAM cell.
Figure 3A:
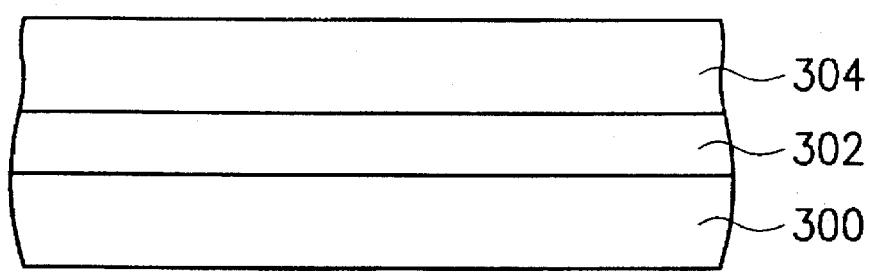
FIGS. 3A to 3G are cross-sectional views showing processing steps for fabricating a DRAM cell with a vertical channel structure, according to an embodiment of the invention.

Referring to FIG. 3A, first, an N-doped region 302 is formed in a P-type silicon substrate 300, for example by implanting arsenic ions with an energy of about 50–100 KeV to provide a dosage of about $1\times10^{15}$–$1\times10^{16}$ atoms/cm$^2$. Then an N-doped epitaxial silicon layer 304 with a thickness of about 2 μm is formed above the N-doped region 302. The epitaxial silicon layer 304 can be formed, for example, by depositing it at a pressure of about 50 Torr and a temperature of about 950° C., and using SiH$_2$Cl$_2$, and H$_2$, and HCl as the reactive gases.

Figure 3B:
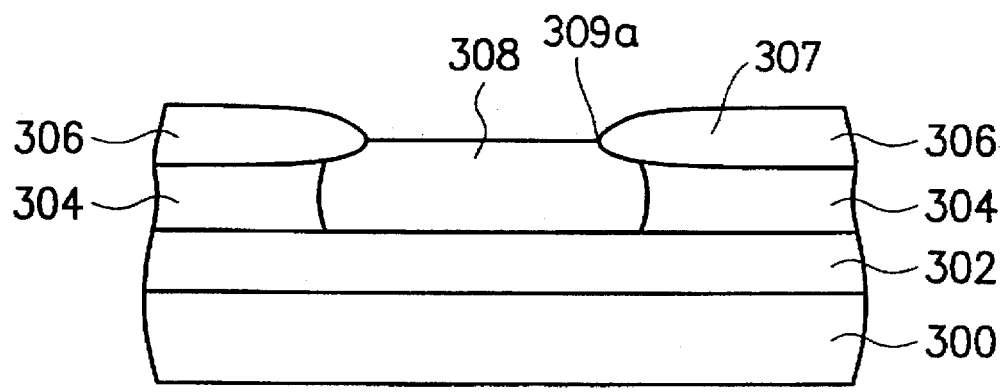

Referring to FIG. 3B, active areas are then defined, and a field oxide layer 306 with a bird's beak structure 307 is formed in the non-active areas. With the field oxide layer 306 as a mask, ions are implanted in the epitaxial silicon layer 304 to form a P-well 308. For example, boron ions may be implanted at an energy of about 100–200 KeV to provide a dosage of about $1\times10^{13}$–$1\times10^{14}$ atoms/cm$^2$. The P-well 308 encroaches upon areas beneath the bird's beak structure 307 of the field oxide layer 306, and its bottom comes into contact with the top surface of the N-doped region 302.

Figure 3C:
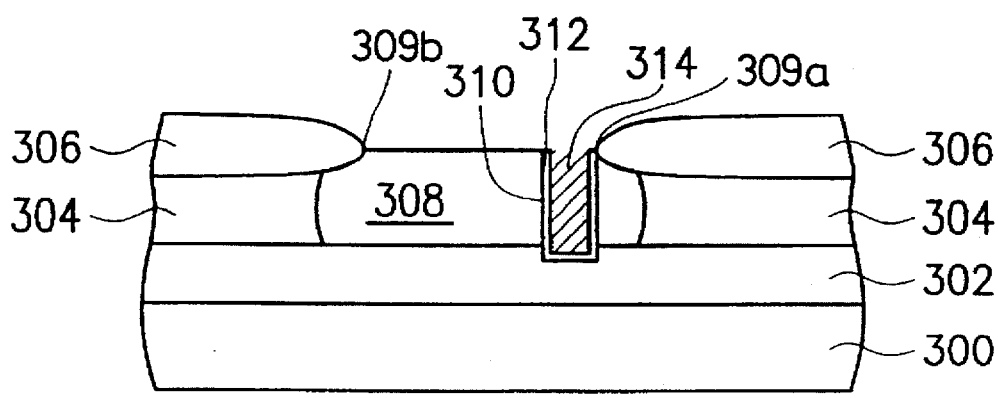

Referring to FIG. 3C, using conventional photolithography and etching, a trench 310, at least passing through the P-well 308 and in contact with the N-doped region 302, is formed vertically down along the edge 309a of the bird's beak structure 307. Next, a gate oxide layer 312 is formed on the surface of the trench 310. Then, a first polysilicon layer 314 (to serve as a gate) is deposited in the trench 310, and this is followed by an etching back of the first polysilicon layer 314 and the gate oxide layer 315. As a result, the gate oxide layer 312 covers only the interior sidewalls of trench 310, while the first polysilicon layer 314 almost completely fills the remaining space within the trench 310. To increase the electrical conductivity of the first polysilicon layer 314, ions such as arsenic can be implanted.

Figure 3D:
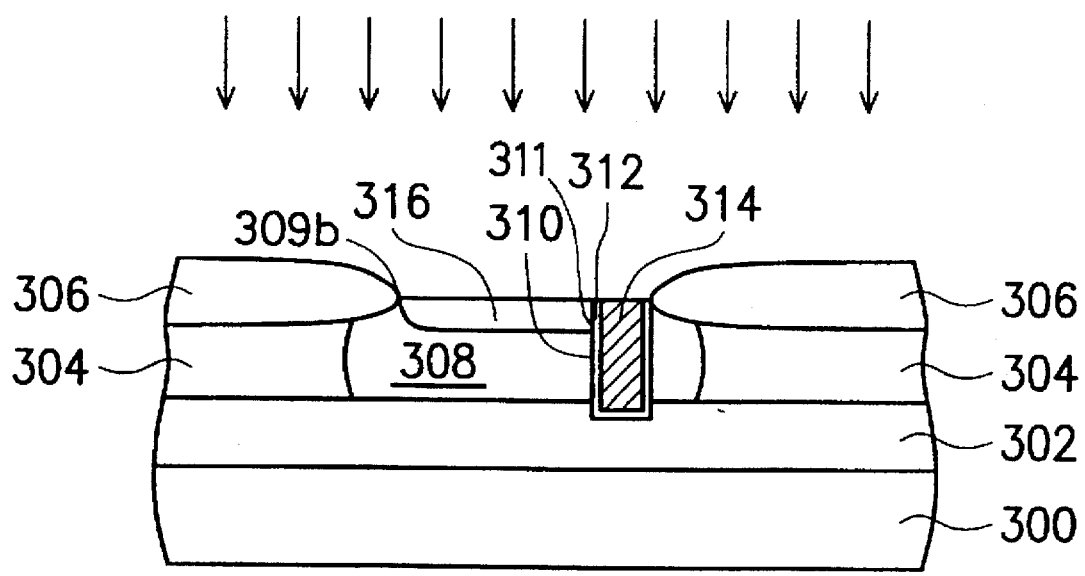

Referring to FIG. 3D, using conventional photolithography, an N-doped region 316, to serve as a drain region, is formed in the P-well 308 between an edge 311 of the trench 310 and the edge 309b of the bird's beak of the field oxide layer 306, by an N-type ion implantation procedure. For example, arsenic ions are implanted with an energy of about 50–100 KeV to provide a dosage of about $1 \times 10^{15} - 1 \times 10^{16}$ atoms/cm$^2$ and form the N-doped region 316. At this point, a MOS transistor with a vertical channel is formed which consists of a source region 302, a drain region 316 and a gate 314.

Figure 3E:
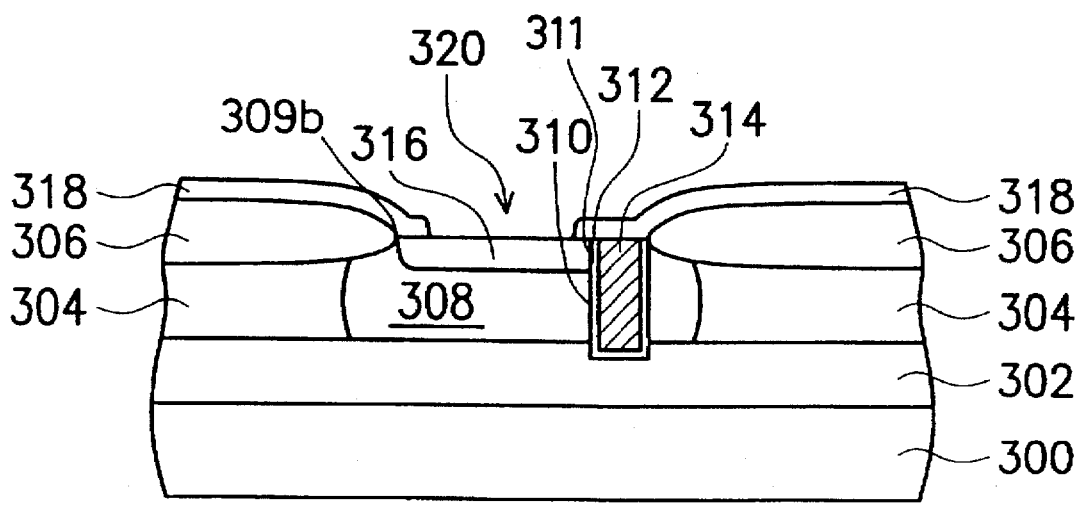

Referring to FIG. 3E, a silicon dioxide layer 318 is formed by chemical vapor deposition, and then, with the use of photolithographic techniques, a contact window 320 is formed above the drain region 316.

Figure 3F:
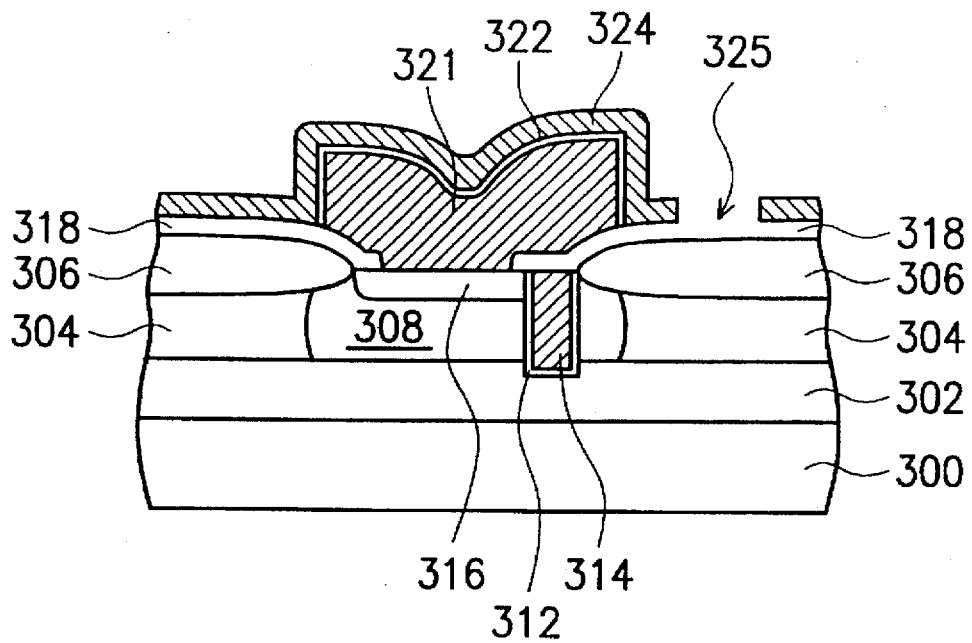

Referring to FIG. 3F, a storage capacitor is next formed. Initially, a second polysilicon layer 321 with a thickness of about 3000–5000 Å is formed above and within the contact window 320. Then, again using conventional photolithographic and etching techniques, the second polysilicon layer 321 is defined in order to form the storage electrode of STET storage capacitor. Thereafter, on the naked surface of the second polysilicon layer 321, a layer of dielectric 322 is formed, for example, of a nitride/oxide (NO) layer or an oxide/nitride/oxide (ONO) layer, or any similar structure. Next, a third polysilicon layer 324, to serve as the opposing electrode, is formed above the surface of the dielectric layer 322. The third polysilicon layer 324 may, for example, be deposited by CVD method to a thickness of about 1000–2000 Å. Then, using phosphorus oxychloride (POCl$_3$) as a dopant source, the third polysilicon layer 324 is doped to increase its electrical conductivity. Lastly, using conventional photolithographic and etching techniques, the third polysilicon layer 324 is defined and a contact window 325 is formed in predefined areas, to complete the formation of storage capacitor for the DRAM.

Figure 3G:
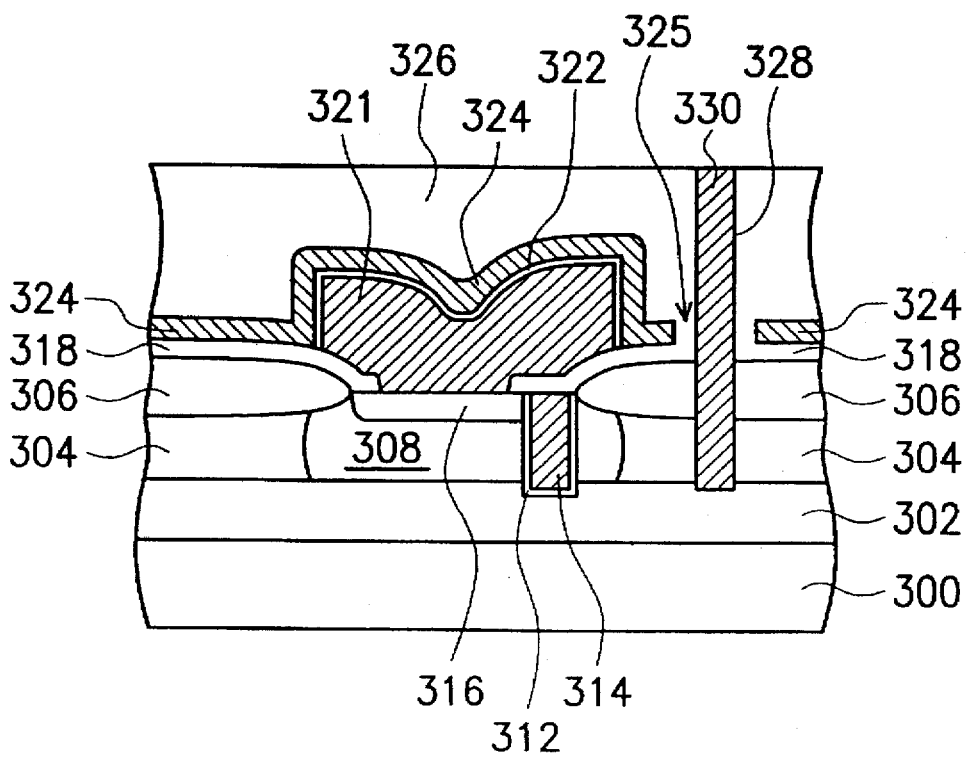

Referring to FIG. 3G, a planarization process is performed using chemical vapor deposition to form a planarization insulating layer 326 made, for example, of borophosphosilicate glass (BPSG). Then, the planarization insulating layer 326 is subjected to planarization through heat fluidization at about 850°–950° C. Next, using photolithographic techniques, the planarization insulating layer 326, the silicon oxide layer 318, the field oxide layer 306 and the epitaxial silicon layer 304 are successively etched until the top surface of the source region 302 is exposed, forming a contact window 328 for a bit line. Thereafter, a tungsten plug 330, which is spaced from and therefore not in contact with the third polysilicon layer 324, is formed in the contact window 328. Other subsequent conventional processing steps are then performed to complete the DRAM IC with a vertical channel structure.

As those who are familiar with such IC technologies will understand, although an NMOS transistor is used as an example in the above embodiment, the applications of this invention are by no means so limited. For example, a PMOS transistor also may be formed according to the invention.

Those familiar with such IC technologies also will recognize several special characteristics in applying the disclosed invention, including:

1. The channel thus formed is a vertical one.
2. The size of the memory cell is basically the same as the size of its storage capacitor, and so the surface area requirement of the memory cell is less than that manufactured by conventional methods; the invention therefore offers an increase in level of integration in wafer fabrication.
3. The bit line of a DRAM formed according to this invention is embedded.
4. The contact window for the embedded bit line of this DRAM is formed above the field oxide layer.

While the invention has been described by way of example and terms of a preferred embodiment, it is to be understood that the invention is not limited thereto. To the contrary, it is intended to cover various modifications and similar arrangements and procedures, and the scope of the appended claims therefore should be accorded the broadest interpretation so as to encompass all such modifications and similar arrangements and procedures.

What is claimed is:

1. A method of fabricating a DRAM with a vertical channel structure, comprising the steps of:

(a) forming a source region on top of a silicon substrate;

(b) forming an epitaxial silicon layer above the source region;

(c) defining active regions in the epitaxial silicon layer;

(d) on a surface of the epitaxial silicon layer, forming a field oxide layer having a bird's beak structure, just outside the active area;

(e) using the field oxide layer as a mask, forming a well such that a bottom of the well is in contact with a top surface of the source region;

(f) forming a trench passing through at least the well to at least a top surface of the source region;

(g) forming a first insulating layer on interior sidewalls and a bottom surface of the trench, and forming a gate that almost completely fills a remaining space in the trench;

(h) in the well, forming a drain region lying between one edge of the gate and a remote edge of the bird's beak structure;

(i) forming a second insulating layer with a contact window above the drain region; and;

(j) forming a storage capacitor above the contact window.

2. A method according to claim 1, wherein the silicon substrate and the well are of the P-type, whereas the source region, the drain region and the epitaxial silicon layer are of the N-type.

3. A method according to claim 1, wherein said step (b) comprises the step of depositing the epitaxial layer to a thickness of about 2 μm under a pressure of about 50 Torr and a temperature of about 950° C., using SiH$_2$Cl$_2$, H$_2$, and HCl as reactive gases.

4. A method according to claim 1, wherein said step (j) of forming the storage capacitor includes the steps of:

forming a storage electrode of at least a second polysilicon layer, above the first contact window;

forming a dielectric layer above the second polysilicon layer; and forming an opposed electrode of at least a third polysilicon layer, above the dielectric layer.

5. A method according to claim 4, wherein the second polysilicon layer has a thickness of about 3000–5000 Å.

6. A method according to claim 4, wherein the dielectric layer is an oxide/nitride/oxide layer.

7. A method according to claim 4, wherein the third polysilicon layer has a thickness of about 1000–2000 Å, and is doped by a phosphorus dopant source.

8. A method according to claim 1, further comprising the following steps performed after said step (j):

depositing a borophosphosilicate glass layer by chemical vapor deposition; and planarizing the borophosphosilicate glass by heat fluidization at a temperature of about 850°–9500° C.

9. A method according to claim 2, wherein said step (a) includes forming the source region by implanting arsenic ions at an energy of about 50–100 KeV to provide a dosage of about $1\times10^{15}$–$1\times10^{16}$ atoms/cm$^2$.

10. A method according to claim 2, wherein said step of forming a well includes implanting boron ions at an energy of about 100–200 KeV to provide a dosage of about $1\times10^{13}$–$1\times10^{14}$ atoms/cm$^2$.

11. A method according to claim 2, wherein said step of forming the drain region includes implanting arsenic ions at an energy of about 50–100 KeV to provide a dosage of about $1\times10^{15}$–$1\times10^{16}$ atoms/cm$^2$.

* * * * *